United States Patent
Negishi

(10) Patent No.: US 8,111,082 B2
(45) Date of Patent: Feb. 7, 2012

(54) TEST APPARATUS

(75) Inventor: Toshiyuki Negishi, Tokyo (JP)

(73) Assignee: Advantest Corporation, Tokyo (JP)

( * ) Notice: Subject to any disclaimer, the term of this patent is extended or adjusted under 35 U.S.C. 154(b) by 274 days.

(21) Appl. No.: 12/598,736

(22) PCT Filed: Jun. 9, 2008

(86) PCT No.: PCT/JP2008/001471
§ 371 (c)(1),
(2), (4) Date: Nov. 3, 2009

(87) PCT Pub. No.: WO2009/150695
PCT Pub. Date: Dec. 17, 2009

(65) Prior Publication Data
US 2010/0213967 A1 Aug. 26, 2010

(51) Int. Cl.
*G01R 31/02* (2006.01)
*G01R 31/26* (2006.01)
(52) U.S. Cl. .................................. 324/762.01
(58) Field of Classification Search .......... None
See application file for complete search history.

(56) References Cited

FOREIGN PATENT DOCUMENTS

| JP | 02-062983 | 3/1990 |
| JP | 2005-285160 A | 10/2005 |
| JP | 2006-003216 A | 1/2006 |
| JP | 2007-017257 | 1/2007 |
| JP | 2008-028628 | 2/2008 |

OTHER PUBLICATIONS

PCT International Preliminary Report on Patentability for PCT Application No. PCT/JP2008/001471 mailed on Dec. 23, 2010, with an English-language translation dated Jan. 20, 2011.

*Primary Examiner* — Roberto Velez
(74) *Attorney, Agent, or Firm* — Ladas & Parry, LLP

(57) ABSTRACT

A test apparatus is configured such that two adjacent channels form a pair. Timing comparators determine the level of first output data fed from a DUT, respectively, timed in accordance with strobe signals, respectively. Clock envelope extractors extract envelopes of a clock, respectively. A clock recovery circuit recovers a strobe signal. A first main latch latches an output from the first timing comparator, timed by the first strobe signal. A first sub-latch latches the envelope of the clock, timed by the first strobe signal. An output from the sub-latch is supplied to a second main latch of the second channel. A signal dependent on the strobe signal is assigned an adjustable delay by a first delay circuit and is supplied to a clock terminal of the second main latch.

2 Claims, 5 Drawing Sheets

TEST APPARATUS

BACKGROUND OF THE INVENTION

1. Field of Invention

The present invention relates to a test apparatus.

2. Description of the Related Art

Serial data transfer is used to transmit and receive data between semiconductor circuits via relatively few data transmission lines. Clock and data recovery (CDR) or source synchronous clocking is used in serial data transfer. In CDR, 8B10B encoding or 4B5B encoding is used to encode serial data such that the data does maintain the same value continuously for a predetermined period of time or longer. A clock for synchronization is embedded in the serial data.

In testing a semiconductor circuit designed to output serial data as a device under test (DUT), a CDR circuit is provided at the input stage of a semiconductor test apparatus (sometimes simply referred to as test apparatus). The CDR circuit extracts from the serial data a reference clock signal. The circuit generates a strobe signal based on the clock signal thus extracted and latches the bit data of the serial data accordingly. The test apparatus compares recovered data with expected values that the data should take so as to determine whether the DUT is defective or not. Patent documents 1 and 2 disclose a related technology.

For example, patent document 2 discloses a CDR circuit where a phase locked loop (PLL) is used. In this circuit, the oscillation frequency of a voltage controlled oscillator is controlled so that the phase of a clock signal accompanying the serial data matches the phase of the strobe signal generated based on the clock signal. As a result, the phase of the strobe signal can be adjusted to track the jitter of the serial data.

In one of the methods of testing a DUT, a margin test is performed in which a timing margin or an amplitude margin is tested. In other words, the phase of the strobe signal recovered by CDR is shifted gradually in predetermined steps, as the serial data from the DUT is latched (captured). A determination of pass or failure is made for each phase. Alternatively, the threshold voltage for determination of the level (0 or 1) of the serial data is changed between a plurality of levels, as the serial data from the DUT is latched (captured). A determination of pass or failure is made for each level. By performing margin tests using a plurality of parameters (e.g., combinations of timing and amplitude), a Shmoo plot where passes and failures are plotted can be produced for each of the combinations of parameters organized as a matrix.

When the timing of output of serial data from the DUT varies temporally, the hunt function is taken advantage of. The hunt function identifies the timing of data output from the DUT by embedding a predetermined pattern at the head of the serial data and detecting the predetermined pattern in the test apparatus. After identifying the head position in the serial data using the hunt function, the test apparatus starts comparing the serial data with the expected value pattern (see patent document No. 3).

[patent document No. 1] JP H2-62983
[patent document No. 2] JP 2007-17257
[patent document No. 3] JP 2006-3216
[patent document No. 4] JP 2008-28628

It will be assumed that the aforementioned margin test is performed in a test apparatus provided with the hunt function. In this case, the hunt function may not work properly due to the failure to capture the header pattern properly, if the timing of capturing data or the threshold voltage for level determination is changed in a margin test. Failure to identify the position of the header pattern properly results in an offset between the cycle of serial data from the DUT and that of expected value pattern, making it impossible to give a determination of pass or failure properly. Such a problem may also be caused in performing a test other than a margin test.

SUMMARY OF THE INVENTION

The present invention addresses the problem and a purpose thereof is to provide a test apparatus capable of performing various tests, while also performing a hunt process.

One embodiment of the present invention relates to a test apparatus for testing data in a plurality of channels output from a device under test. The channels of the test apparatus are organized as pairs each including two adjacent channels. Each pair includes the first channel and the second channel. The first channel comprises: a first timing comparator operative to determine the level of first output data fed from the device under test to the first channel, timed in accordance with a first strobe signal; a first clock envelope extractor operative to extract an envelope of a clock from the first output data; a first clock recovery circuit operative to recover the first strobe signal with reference to the envelope of the clock extracted by the first clock envelope extractor; a first main latch circuit operative to latch an output from the first timing comparator, timed in accordance with the first strobe signal; a first sub-latch circuit operative to latch the envelope of the clock extracted by the first clock envelope extractor, timed in accordance with the first strobe signal; a first hunt circuit operative to compare an output from the first main latch circuit with a predetermined header pattern; and a first expected value comparison unit operative to compare the output from the first main latch circuit with a predetermined expected value pattern, in response to the detection by the first hunt circuit that the output from the first main latch circuit matches the header pattern. The second channel comprises: a second timing comparator operative to determine the level of second output data fed from the device under test to the second channel, timed in accordance with a second strobe signal; a second clock envelope extractor operative to extract an envelope of a clock from the second output data; a second clock recovery circuit operative to recover the second strobe signal with reference to the envelope of the clock extracted by the second clock envelope extractor; a first delay circuit operative to apply a variable phase shift to the first strobe signal; a first selector operative to receive an output from the second timing comparator and an output from the first sub-latch circuit, and select and output one of the outputs; a second selector operative to receive an output from the first delay circuit and the second strobe signal, and select and output the output or the signal; a second main latch circuit operative to latch an output from the first selector, timed in accordance with an output signal from the second selector; a second hunt circuit operative to compare an output from the second main latch circuit with a predetermined header pattern; and a second expected value comparison unit operative to compare the output from the second main latch circuit with a predetermined expected value pattern, in response to the detection by the second hunt circuit that the output from the second main latch circuit matches the header pattern, According to this embodiment, the first mode where the first selector is caused to select the output from the second timing comparator and the second selector is caused to select the second strobe signal, and the second mode where the first selector is caused to select the output from the first sub-latch circuit and the second selector is caused to select the output of the first delay circuit. In the first mode, tests can be performed independently in the first channel and in the second channel.

In the second mode, a timing margin test can be performed by changing the amount of phase shift in the first delay circuit, without affecting the hunt function.

The second channel may further comprise: a second sub-latch circuit operative to latch the envelope of the clock extracted by the second clock envelope extractor, timed in accordance with the second strobe signal. The first channel may further comprise: a second delay circuit operative to apply a variable phase shift to the second strobe signal; a third selector operative to receive the output from the first timing comparator and an output from the second sub-latch circuit, and select and output one of the outputs; and a fourth selector operative to receive an output from the second delay circuit and the first strobe signal, and select and output the output or the signal. The first main latch circuit may be adapted to latch an output from the third selector, timed in accordance with an output signal from the fourth selector. The first and second channels may be symmetrically configured.

It is to be noted that any arbitrary combination or rearrangement of the above-described structural components and so forth is effective as and encompassed by the present embodiments.

Moreover, this summary of the invention does not necessarily describe all necessary features so that the invention may also be a sub-combination of these described features.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE INVENTION

A description will be given, with reference to the drawings, of a suitable embodiment of the present invention. In the figures, like numerals represent like constituting elements, members, and processes and the description thereof is omitted as appropriate. Reference herein to details of the illustrated embodiments is not intended to limit the scope of the claims. It should be understood that not all of the features and the combination thereof discussed are essential to the invention.

Figure 1:
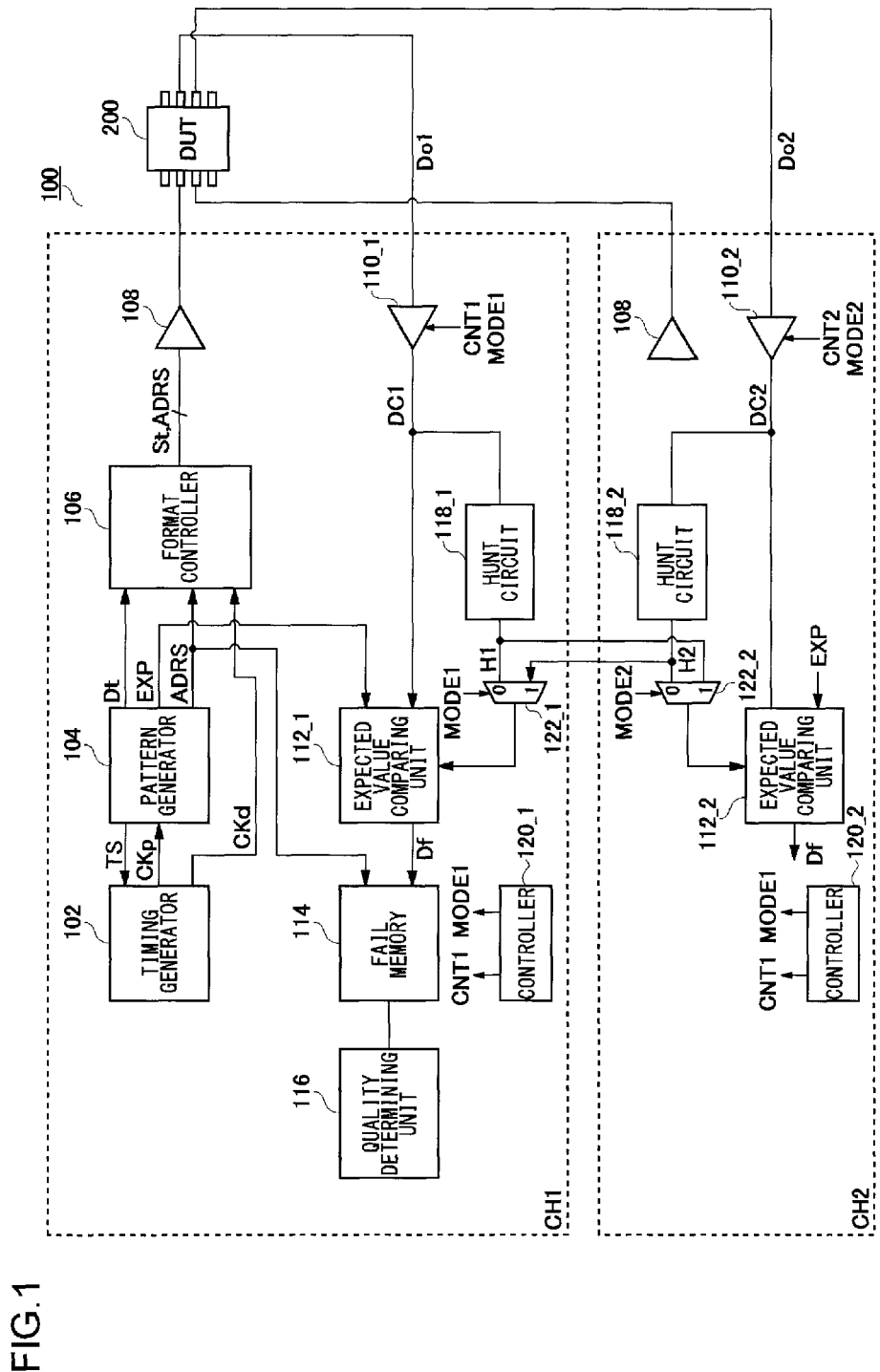
FIG. 1 is a block diagram showing the overall structure of a test apparatus according to the embodiment.

FIG. 1 is a block diagram showing the structure of a test apparatus 100 according to the embodiment. The test apparatus 100 writes data in a DUT 200 and subsequently reads the written data itself or the data resulting from subjecting the data to signal processing by the DUT 200. The apparatus 100 then determines whether the read data matches an expected value. For ease of understanding, the following description assumes that the DUT 200 is a memory. However, the type of DUT is non-limiting.

The test apparatus 100 is provided with a plurality of channels CH. Each channel is provided with a timing generator 102, a pattern generator 104, a format controller 106, a write driver 108, an input processing unit 110, an expected value comparing unit 112, a fail memory 114, a quality determining unit 116, and a hunt circuit 118. The plurality of channels CH are organized as pairs each including two adjacent channels. FIG. 1 shows a first channel CH1 and a second channel CH2 by way of example. The channels have the identical structure so that the following description highlights the first channel CH1 by way of example.

The pattern generator 104 generates a timing set signal (hereinafter, referred to as "TS signal") and supplies the signal to the timing generator 102. The timing generator 102 generates a periodic clock CKp and a delayed clock CKd, timed by the timing data designated by the TS signal, supplies the periodic clock CKp to the pattern generator 104, and supplies the delayed clock CKd to the format controller 106. The pattern generator 104 generates an address ADRS indicating each of a plurality of storage areas (referred to as blocks) provided in the DUT 200, and a plurality of test pattern data items Dt that should be written in the plurality of blocks. The generator 104 supplies the address and the data to the format controller 106.

In accordance with the delayed clock CKd supplied from the timing generator 102, the format controller 106 generates a test pattern signal St determined by the test pattern data Dt generated by the pattern generator 104. The write driver 108 receives the address ADRS output from the format controller 106 and the test pattern signal St and supplies the address and the signal to the DUT 200.

The pattern generator 104 generates expected value data EXP that the DUT 200 is expected to output in response to the address ADRS and the test pattern signal St, and supplies the data to the expected value comparing unit 112.

An input processing unit 110_1 receives output data Do responsive to the address ADRS from the DUT 200. The unit 110_1 determines the level of the data and outputs the level to an expected value comparing unit 112_1. Output data Do_1 fed to the test apparatus 100 is subject to the influence from the DUT 200 or a transmission line and so contains jitter. The input processing unit 110_1 has the function of generating a strobe signal that tracks the jitter. As will be described in detail later, the input processing unit 110_1 extracts an edge (envelope of the clock) embedded in the output data Do of serial format, using the clock data recovery (CDR) method, so as to recover the strobe signal based on the envelope of the clock (hereinafter, referred to as clock envelope signal). The input processing unit 110_1 latches output data Do1, timed in accordance with the strobe signal thus recovered, and outputs the latched data as digital comparison data DC1.

The expected value comparing unit 112_1 compares the digital comparison data DC1 with the expected value data EXP supplied from the pattern generator 104, and outputs fail data Df when the digital comparison data DC1 and the expected value data EXP fail to match.

The fail memory 114 sequentially stores the fail data Df output from the expected value comparing unit 112, associating the data with the address ADRS generated by the pattern generator 104. The quality determining unit 116 determines whether or not the DUT 200 is defective or identifies a defective area, based on information stored in the fail memory 114 and indicating pass or failure on a bit-by-bit basis.

A predetermined header pattern is embedded in the output data Do1 from the DUT 200 such that the header pattern precedes data to be compared with the expected value by a predetermined number of cycles. A hunt circuit 118_1 compares the digital comparison data DC1 with the predetermined header pattern and generates a hunt signal H1 indicating the time when the digital comparison data DC1 matches the header pattern.

The hunt signal H1 is fed to a logical comparison unit 112_1 via a selector 122_1. The logical comparison unit 112_1 starts comparing the expected value pattern EXP with the first digital comparison data DC1, timed in accordance with the hunt signal H1. This function will be referred to as the hunt function. As needed, the logical comparison unit 112_1 shifts the cycle of expected value EXP so as to match the corresponding cycle of the first digital comparison data DC1.

The input processing unit 110_1 is adapted to control the phase of the strobe signal in accordance with a control signal CNT1 from a controller 120_1. Normally, the strobe signal is made to coincide with the neighborhood of center between edges of serial data latched by the strobe signal, in consideration of the setup time and the hold time.

The test apparatus 100 shifts the strobe signal to precede or follow the neighborhood of the center and generates the digital comparison data DC1 for the respective positions of the strobe signal so as to determine whether the DUT 200 is defective or not. This function allows a timing margin test to be performed.

Given above is a brief description of the overall structure and operation of the test apparatus 100. Taking the first channel CH1 by way of example, the value of the digital comparison data DC1 is affected if the timing margin test is performed and the timing of strobe signal is changed accordingly. This will results in the failure of the hunt circuit 118_1 to hunt the header pattern, producing incorrect results of comparison by the logical comparison unit 112_1.

To address the problem, the test apparatus 100 according to the embodiment is configured to perform a hunt process in one of the two adjacent channels and perform a timing margin test in the other. As mentioned above, the first and second channels CH1 and CH2 are configured similarly. A hunt circuit 118_2 of the second channel CH2 generates a second hunt signal H2. The second hunt signal is fed to a logical comparison unit 112_1 via a selector 122_1. The logical comparison unit 112_1 starts a comparison process, timed in accordance with the first hunt signal H1 or the second hunt signal H2 selected according to a mode selection signal MODE2.

Conversely, the hunt circuit 118_1 of the first channel CH1 outputs the hunt signal H1 to the second channel CH2. In symmetry with the first channel CH1, the second channel CH2 is also provided with a logical comparison unit 112_2 and a selector 122_2.

Figure 2:
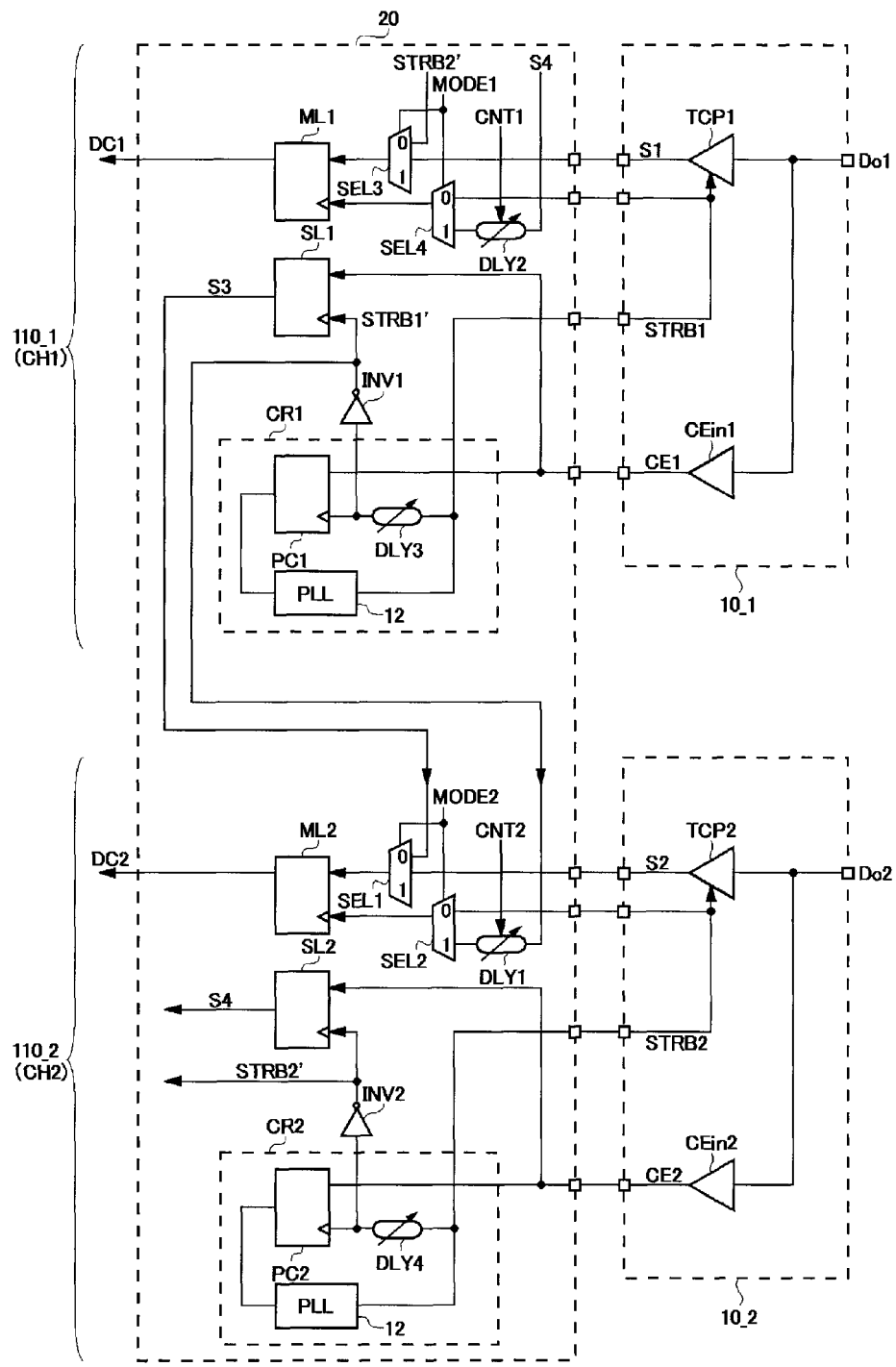
FIG. 2 is a block diagram showing the structure of the test apparatus of FIG. 1 in detail.

FIG. 2 is a block diagram showing the structure of the input processing unit 110 of the test apparatus of FIG. 1 in detail. The input processing unit 110 for the channels of FIG. 1 comprises a pair in adaptation to two adjacent channels.

The input processing units 110_1 and 110_2 for the two adjacent channels comprise a first comparator chip 10_1, a second comparator chip 10_2, and a front end chip 20. In this embodiment, it will be assumed that these components are implemented as individual semiconductor chips. In an alternative embodiment, some of the components may be integrated.

A description will first be given of the structure of the input processing unit 110_1 of the first channel. The input processing unit 110_1 of the first channel comprises a first timing comparator TCP1, a first clock envelope extractor CEin1, a first main latch ML1, a first sub-latch SL1, a first clock recovery circuit CR1, a third selector SEL3, a fourth selector SEL4, and a second delay circuit DLY2. The input processing unit 110_2 of the second channel comprises a second timing comparator TCP2, a second clock envelope extractor CEin2, a second main latch ML2, a second sub-latch SL2, a second clock recovery circuit CR2, a first selector SEL1, a second selector SEL2, and a first delay circuit DLY1. In other words, the input processing units 110_1 and 110_2 of the two adjacent channels are symmetrically configured.

The following description highlights the input processing unit 110_1 by way of example. The first timing comparator TCP1 determines the level of the first output data Do1 fed from the DUT 200 to the first channel, timed in accordance with a first strobe signal STRB1.

The first output data Do1 from the DUT 200 is encoded in the 8B10B format or the 4B5B format so that the data does not maintain the same value continuously for a predetermined period of time or longer. In other words, the data is encoded so that the data presents an edge at certain time intervals.

A first clock envelope extractor (also referred to as transition detecting circuit) CEin1 extracts an edge embedded in the first output data Do1 as a clock envelope signal CE1. For example, given that the serial data is encoded in the 8B10B format, the first clock envelope extractor CEin1 extracts the embedded clock envelope signal, based on an edge occurring in the first output data Do1. Since the first clock envelope extractor CEin1 may use the publicly known technology, the detailed description will be omitted.

The first clock recovery circuit CR1 recovers the first strobe signal STRB1 with reference to the clock envelope signal CE1 extracted by the first clock envelope extractor CEin1.

The first clock recovery circuit CR1 includes a first PLL 12, a first phase comparator PC1, and a third delay circuit DLY3. The third delay circuit DLY3 applies a delay to the first strobe signal STRB1. The first phase comparator PC1 compares the phase (timing) of the edge of the delayed first strobe signal STRB1 with that of the clock envelope signal CE1. The first PLL 12 adjusts the timing of the edge of the first strobe signal STRB1 in accordance with the result of phase comparison by the first phase comparator PC1. The first clock recovery circuit CR1 generates the strobe signal STRB1 that tracks the jitter and supplies it to the first timing comparator TCP1.

The first clock recovery circuit CR1 need not be implemented by a PLL and may be implemented in other ways such as a delayed clock loop (DLL).

To simplify the description, the configuration using the third selector SEL3, the fourth selector SEL4, and the second delay circuit DLY2 will be described.

The first main latch ML latches an output S1 of the first timing comparator TCP1, timed in accordance with the first strobe signal STRB1. The latched data is output as the digital comparison data DC1 to the logical comparison unit 112 and the hunt circuit 118 in the subsequent stage.

An output from the first clock envelope extractor CEin1 is fed to the data input terminal of the first sub-latch SL1. A first strobe signal STRB1' derived from delaying the strobe signal by the third delay circuit DLY3 and inverted by a first inverter INV1 is fed to the clock terminal of the first sub-latch SL1. In other words, the first sub-latch SL1 latches the clock envelope signal CE1, timed in accordance with the first strobe signal STRB1. Latched data S3 is output to the input processing unit 110_2 of the second channel along with the first strobe signal STRB1'.

Described above is the structure of the first channel. A description will now be given of the second channel. The constituting elements of the second channel have the same function and structure as the corresponding constituting elements of the first channel so that the same description will not be repeated. The strobe signal STRB1' and the data S3 generated in the input processing unit 110_1 of the first channel are fed to the input processing unit 110_2 of the second channel.

The second timing comparator TCP2 determines the level of second output data Do2 fed from the DUT 200 to the second channel, timed in accordance with a second strobe signal STRB2.

A second clock envelope extractor CEin2 extracts a clock envelope signal CE2 from the second output data Do2. The second clock recovery circuit CR2 recovers the second strobe signal STRB2 with reference to the clock envelope signal CE2 extracted by the second clock envelope extractor CEin2.

The first delay circuit DLY1 receives the first strobe signal STRB1' generated in the first channel and applies a variable delay (phase shift) to the signal, in accordance with the control signal CNT output from the controller 120 of FIG. 1.

The first selector SEL1 receives an output S2 from the second timing comparator TCP2 and the output S3 from the first sub-latch circuit SL1, and selects and outputs one of the outputs in accordance with the mode selection signal MODE2 output from the controller 120 of FIG. 1. More specifically, the first selector SEL1 selects the signal S2 when the mode selection signal MODE2 is 0, and selects the signal S3 when MODE2 is 1.

The second selector SEL2 receives an output from the first delay circuit DLY1 and the second strobe signal STRB2, and selects and outputs the output or the signal, in accordance with the mode selection signal MODE2. More specifically, the second selector SEL2 selects the second strobe signal STRB2 when the mode selection signal MODE2 is 0, and selects the first strobe signal STRB1' delayed by the first delay circuit DLY1 when MODE2 is 1.

The second main latch ML2 latches an output from the first selector SEL1, timed in accordance with an output signal from the second selector SEL2. The latched data is output as digital comparison data DC2 to the logical comparison unit 112 and the hunt circuit 118 in the subsequent stage.

Described above is the basic structure of the input processing unit 110. A description will now be given of the operation of the input processing units 110_1 and 110_2. The third selector SEL3 and the fourth selector SEL4 of the first channel will continue to be omitted from the description.

Irrespective of the operating condition of the second channel, the input processing unit 110_1 of the first channel generates the strobe signal STRB1 synchronized with the first output data Do1 and generates the first digital comparison data DC1. The hunt circuit 118_1 of the first channel compares the first digital channel data DC1 with the header pattern so as to generate the hunt signal H1. The logical comparison unit 112_1 of the first channel compares the first digital comparison data DC1 with the expected value pattern EXP, timed in accordance with the hunt signal H1, so as to determine whether the DUT is defective or not based on the output data Do1 of the first channel.

The following description will highlight the second channel. The input processing unit 110_2 of the second channel operates in the independent mode or a margin test mode, in accordance with the value of the mode selection signal MODE2.

When the mode selection signal MODE2 is 0, the input processing unit 110_2 of the second channel is set to the independent mode. In the independent mode, the input processing unit 110_2 of the second channel is independent of the first channel and processes the second output data Do1 similarly to the input processing unit 110_1. More specifically, the selector 122_2 selects the hunt signal H2 generated by the second hunt circuit 118_2 and outputs the signal to the logical comparison unit 112_2. The logical comparison unit 112_2 compares the second digital comparison data DC2 with the expected value pattern EXP.

When the mode selection signal MODE2 is 1, the input processing unit 110_2 is set to the margin test mode. In the margin test mode, the second main latch ML2 latches the output signal S3 from the first sub-latch circuit SL1, timed in accordance with the first strobe signal STRB1' applied a variable delay by the first delay circuit DLY1. The second digital comparison data DC2 thus latched is fed to the logical comparison unit 112_2 in the subsequent stage. In the margin test mode, the selector 122_2 selects the hunt signal H1 instead of the hunt signal H2 and supplies the selected signal to the logical comparison unit 112_2. In response to the hunt signal H1, the logical comparison unit 112_2 starts comparing the second digital comparison data DC2 with the expected value data EXP.

By setting the test apparatus 100 according to the embodiment to the margin test mode, the output data Do1 of the first channel CH1 can be hunted by the hunt circuit 118_1 of the first channel CH1. Concurrently, the timing of the strobe signal derived from the output data Do1 can be changed by changing the amount of delay applied by the first delay circuit DLY1 of the second channel CH2 so that a determination of pass or failure can be made by using the logical comparison unit 112_2 of the second channel.

Figure 3:
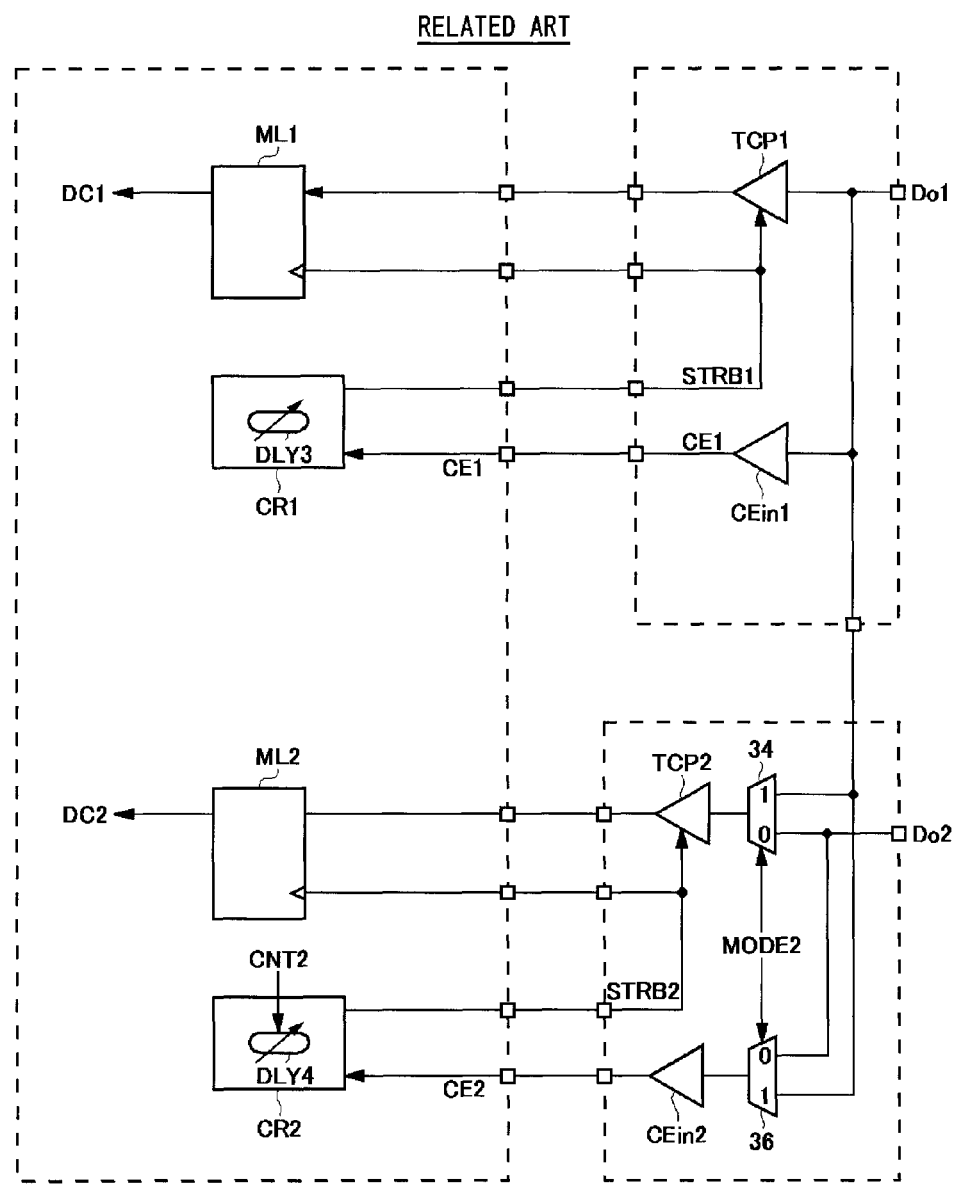
FIG. 3 is a block diagram showing the structure of a test apparatus according to the related art.

The advantage of the test apparatus 100 according to the embodiment will be appreciated by comparing it with the related art as described below. FIG. 3 is a block diagram showing the structure of a test apparatus 300 according to the related art. In the test apparatus 300 of FIG. 3, the first output data Do1 of the first channel CH1 is supplied to the second channel CH2.

The first timing comparator TCP1, the first clock envelope extractor CEin1, the second timing comparator TCP2, and the second clock envelope extractor CEin2 of FIG. 3 correspond to the identically referenced components of FIG. 2. Referring to FIG. 3, selectors 34 and 36 are provided at stages preceding the second timing comparator TCP2 and the second clock envelope extractor CEin2, respectively. The selectors 34 and 36 select the second output data Do2 in the independent mode and select the first output data Do1 in the margin test mode.

When the test apparatus 300 of FIG. 3 is set to the margin test mode, the first output data Do1 is supplied to both the first and second channels. The strobe signals STRB1 and STRB2, and the first digital comparison data DC1 and the second digital comparison data DC2 are generated based on the first output data Do1.

It will be assumed that a hunt process is performed in the first channel CH1 and a timing margin test is performed in the second channel CH2. In this case, the timing of the second strobe signal STRB2 can be changed independently of the first strobe signal STRB1, by fixing the amount of delay applied by the third delay circuit DLY3 in the first clock recovery circuit CR1 (e.g., fixing the amount to 0), and by changing the amount of delay applied by the fourth delay circuit DLY4 in the second clock recovery circuit CR2, centering the amount around ½ the data cycle duration. The timing margin test can be performed by generating the first hunt signal H1 by the hunt circuit 118_1 of the first channel CH1 and by supplying the hunt signal H1 to the logical comparison unit 112_2 of the second channel CH2.

The operation of the first clock recovery circuit CR1 and the second clock recovery circuit CR2 will be highlighted. The PLL circuit of the first clock recovery circuit CR1 generates the strobe signal STRB1 so that the edge of the strobe signal STRB1 coincides with the edge of the clock envelope signal CE1. Similarly, the second clock recovery circuit CR2 generates the strobe signal STRB2 so that the edge of the strobe signal STRB2 coincides with the edge of the clock envelope signal CE2. Ideally, since the clock envelope signals CE1 and CE2 are identical, the timing of the strobe signals STRB1 and STRB2 is adjusted with reference to the same edge of the clock envelope signals CE1 and CE2, respectively.

However, in practical circuits, if the edge of the strobe signal at an initial state is positioned in the neighborhood of the center (dead band) of two adjacent edges of the clock envelope signal, it will not be known how edges will converge into alignment, i.e., whether alignment occurs at the preceding edge or at the following edge. Accordingly, the following problem will occur under certain conditions.

Figure 4:
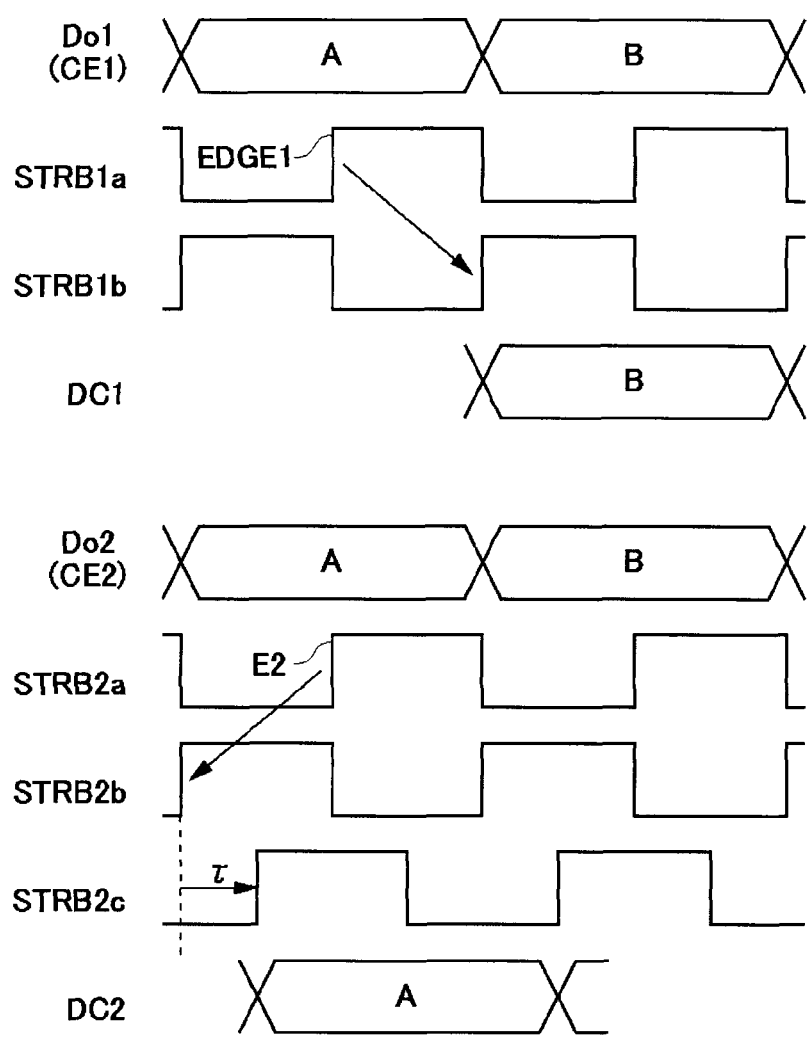
FIG. 4 is a time chart showing the operation of the test apparatus of FIG. 3 according to the related art.

FIG. 4 is a time chart showing the operation of the test apparatus 300 of FIG. 3 according to the related art. It will be assumed that strobe signals STRB1*a* and STRB2*a* of the channels CH1 and CH2, respectively, are positioned at the center of edges of the clock envelope signals CE1 and CE2, respectively, in an initial state. It will also be assumed that the phase of a given edge E1 of the strobe signal STRB1*a* is adjusted by feedback control with reference to the edge of the clock envelope signal CE1 that follows the edge E1 so that convergence occurs as indicated by STRB1*b*. In other words, the edge E1 as adjusted will correspond to data B in the second cycle.

Conversely, it will be assumed that the phase of the edge E2 of the strobe signal STRB2*a* corresponding to the edge E1 is adjusted by feedback control with reference to the edge of the clock envelope signal CE2 that precedes the edge E2 so that convergence occurs as indicated by STRB2*b*. When a variable amount of delay τ is applied to the strobe signal STRB2*b* in a margin test, the strobe signal will be as indicated by STRB2*c*. The strobe signal STRB2*c* is used to latch the data Do2. Therefore, the edge E2 as adjusted will correspond to data A in the first cycle.

Thus, the corresponding edges E1 and E2 of the first and second channels, respectively, may be allocated to different cycles in the circuit of FIG. 3. As a result, the first main latch ML1 and the second main latch ML2 will end up latching data displaced from each other by one cycle. Thus, the first digital comparison data DC1 and the second digital comparison data DC2 will represent data of different cycles. This results in timing deviation between the hunt process and the process of comparison against the expected value.

Figure 5:
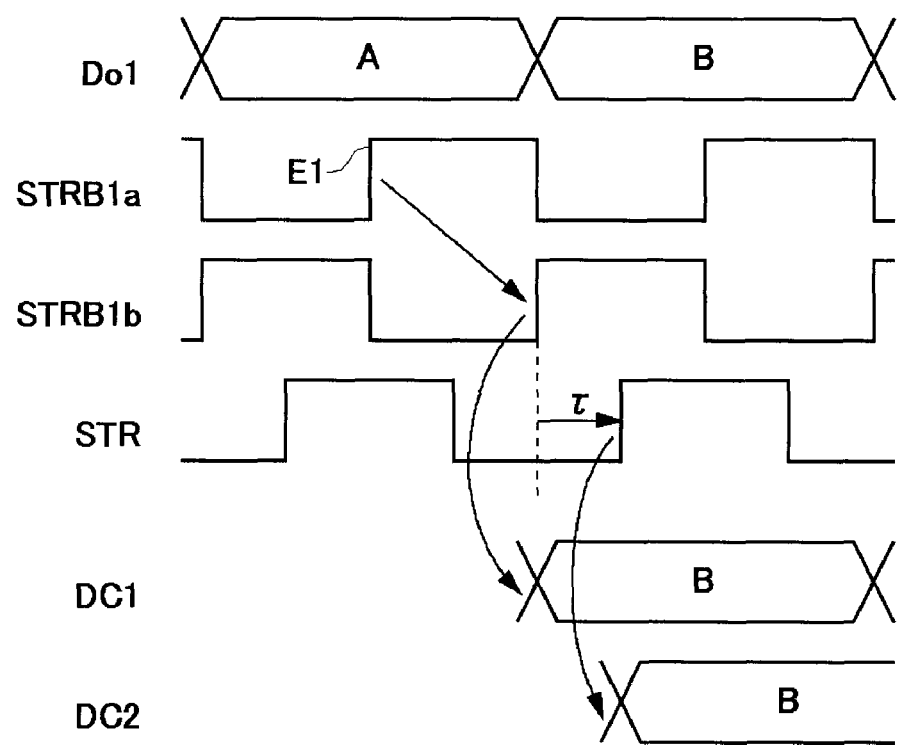
FIG. 5 is a time chart showing the operation of the test apparatus of FIG. 2.

The description of the operation of the circuit of FIG. 2 will be resumed. FIG. 5 is a time chart showing the operation of the test apparatus of FIG. 2. When the input processing units 110_1 and 110_2 of FIG. 2 are used in the margin test mode, the strobe signal STRB1 is generated using the first clock recovery circuit CR1, and an amount of delay τ is applied by the first delay circuit DLY1 to the strobe signal STRB1 thus generated and supplied to the second main latch ML2 of the second channel. Therefore, the strobe signals supplied to the clock terminal of the first main latch ML1 and that of the second main latch ML2 will represent signals corresponding to the same cycle without fail. Therefore, the problem of cycle displacement that occurs in the related art of FIG. 3 is eliminated.

Further, the circuit of FIG. 3 requires terminals for transmitting and receiving signals between the first comparator chip 10_1 and the second comparator chip 10_2. In contrast, the circuit of FIG. 2 does not require terminals or wires connecting the terminals so that the circuit area can be reduced. The circuit of FIG. 2 requires additionally providing the first sub-latch SL1, the second sub-latch SL2, and some selectors. These components only occupy a circuit area sufficiently smaller than the area required by the terminals (pads). Accordingly, the circuit area is reduced as a whole.

Additional features of the circuit of FIG. 2 will be described. The input processing unit 110_1 of FIG. 2 is provided with the third selector SEL3, the fourth selector SEL4, and the second delay circuit DLY2. The input processing unit 110_2 is provided with the second sub-latch SL2. As such, the input processing units 110_1 and 110_2 are symmetrically configured.

In other words, the second sub-latch SL2 latches the clock envelope signal CE2 extracted by the second clock envelope extractor CEin2, timed in accordance with the second strobe signal STRB2'. The second delay circuit DLY2 applies a variable phase shift to the second strobe signal STRB2'. The third selector SEL3 receives the output S1 from the first timing comparator TCP1 and the output S4 from the second sub-latch circuit SL2, and selects and outputs one of the outputs. The fourth selector SEL4 receives the output from the second delay circuit DLY2 and the first strobe signal STRB1, and selects the output or the signal.

By symmetrically configuring the input processing units 110_1 and 110_2, the logical comparison unit 112_1 is capable of performing a timing margin test, while the hunt circuit 118_2 of the second channel performs a hunt process on the second output data Do2.

However, the input processing units 110_1 and 110_2 may not necessarily be symmetrically configured. Non-symmetrical configurations are also encompassed in the scope of the present invention. For example, the third selector SEL3, the fourth selector SEL4, and the second delay circuit DLY2 may be omitted from the input processing unit 110_1. The second sub-latch circuit SEL2 may be omitted from the input processing unit 110_2. This will advantageously reduce the circuit area.

Described above is an illustrative embodiment of the present invention. The embodiment merely illustrates the principle and applications of the present invention and various variations and alternative rearrangements may be practiced without departing from the scope of the present invention as defined by the claims.

What is claimed:

1. A test apparatus for testing data in a plurality of channels output from a device under test, the channels being organized as pairs each including two adjacent channels, wherein, in each pair, the first channel comprises:

a first timing comparator operative to determine the level of first output data fed from the device under test to the first channel, timed in accordance with a first strobe signal;

a first clock envelope extractor operative to extract an envelope of a clock from the first output data;

a first clock recovery circuit operative to recover the first strobe signal with reference to the envelope of the clock extracted by the first clock envelope extractor;

a first main latch circuit operative to latch an output from the first timing comparator, timed in accordance with the first strobe signal;

a first sub-latch circuit operative to latch the envelope of the clock extracted by the first clock envelope extractor, timed in accordance with the first strobe signal;

a first hunt circuit operative to compare an output from the first main latch circuit with a predetermined header pattern; and a first expected value comparison unit operative to compare the output from the first main latch circuit with a predetermined expected value pattern, in response to the detection by the first hunt circuit that the output from the first main latch circuit matches the header pattern, and the second channel comprises:

a second timing comparator operative to determine the level of second output data fed from the device under test to the second channel, timed in accordance with a second strobe signal;

a second clock envelope extractor operative to extract an envelope of a clock from the second output data;

a second clock recovery circuit operative to recover the second strobe signal with reference to the envelope of the clock extracted by the second clock envelope extractor;

a first delay circuit operative to apply a variable phase shift to the first strobe signal;

a first selector operative to receive an output from the second timing comparator and an output from the first sub-latch circuit, and select and output one of the outputs;

a second selector operative to receive an output from the first delay circuit and the second strobe signal, and select and output the output or the signal;

a second main latch circuit operative to latch an output from the first selector, timed in accordance with an output signal from the second selector;

a second hunt circuit operative to compare an output from the second main latch circuit with a predetermined header pattern; and a second expected value comparison unit operative to compare the output from the second main latch circuit with a predetermined expected value pattern, in response to the detection by the second hunt circuit that the output from the second main latch circuit matches the header pattern.

2. The test apparatus according to claim 1, wherein the second channel further comprises:

a second sub-latch circuit operative to latch the envelope of the clock extracted by the second clock envelope extractor, timed in accordance with the second strobe signal, and the first channel further comprises:

a second delay circuit operative to apply a variable phase shift to the second strobe signal;

a third selector operative to receive the output from the first timing comparator and an output from the second sub-latch circuit, and select and output one of the outputs; and a fourth selector operative to receive an output from the second delay circuit and the first strobe signal, and select and output the output or the signal, wherein the first main latch circuit is adapted to latch an output from the third selector, timed in accordance with an output signal from the fourth selector, and the first and second channels are symmetrically configured.

* * * * *